(12) United States Patent
Shen et al.

(10) Patent No.: US 6,204,097 B1
(45) Date of Patent: Mar. 20, 2001

(54) SEMICONDUCTOR DEVICE AND METHOD OF MANUFACTURE

(75) Inventors: Zheng Shen, Chandler; Francine Y. Robb; Stephen P. Robb, both of Tempe, all of AZ (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

(21) Appl. No.: 09/259,602

(22) Filed: Mar. 1, 1999

(51) Int. Cl.[7] .................................................. H01L 21/332
(52) U.S. Cl. ........................................... 438/133; 438/140
(58) Field of Search .................................. 438/133, 135, 438/140, 137, 138

(56) References Cited

U.S. PATENT DOCUMENTS

| 5,032,878 | | 7/1991 | Davies et al. ........................ 357/13 |
|---|---|---|---|
| 5,178,370 | | 1/1993 | Clark et al. ........................ 257/212 |
| 5,216,275 | | 6/1993 | Chen .................................. 257/493 |
| 5,252,848 | | 10/1993 | Adler et al. ........................ 257/328 |
| 5,266,831 | * | 11/1993 | Phipps et al. ...................... 257/620 |
| 5,397,716 | | 3/1995 | Anderson ............................ 437/31 |
| 5,438,215 | | 8/1995 | Tihanyi .............................. 257/401 |
| 5,473,180 | | 12/1995 | Ludikhuize ......................... 257/336 |
| 5,486,718 | * | 1/1996 | Robb et al. ........................ 257/630 |
| 5,589,408 | | 12/1996 | Robb et al. ........................ 437/29 |
| 5,605,852 | * | 2/1997 | Bencuya ............................ 437/40 |
| 5,614,751 | * | 3/1997 | Yilmaz et al. ...................... 257/394 |
| 5,631,484 | | 5/1997 | Tsoi et al. ......................... 257/341 |
| 5,648,670 | * | 7/1997 | Blanchard .......................... 257/329 |
| 5,710,455 | | 1/1998 | Bhatnagar et al. ................ 257/472 |
| 5,747,371 | | 5/1998 | Robb et al. ........................ 438/273 |
| 5,777,373 | | 7/1998 | Groenig ............................ 257/495 |

\* cited by examiner

*Primary Examiner*—Richard Elms
*Assistant Examiner*—Bradley Smith
(74) *Attorney, Agent, or Firm*—Robert D. Atkins; Michael T. Wallace

(57) ABSTRACT

A semiconductor device (10) having a termination structure (25) and a reduced on-resistance. The termination structure (25) is fabricated using the same processing steps that were used for manufacturing an active device region (21). The termination structure (25) and the active device region (21) are formed by etching trenches (22, 23) into a drift layer (14). The trenches (22, 23) are filled with a doped polysilicon trench fill material (24), which is subsequently planarized. The semiconductor device (10) is formed in the trenches (22) filled with the polysilicon trench fill material (24) that are in the active region. The trenches (23) filled with the polysilicon trench fill material (24) in a termination region serve as termination structures.

24 Claims, 2 Drawing Sheets

SEMICONDUCTOR DEVICE AND METHOD OF MANUFACTURE

BACKGROUND OF THE INVENTION

The present invention relates, in general, to semiconductor devices and, more particularly, to power semiconductor devices.

Power semiconductor devices are well known and are used in many applications including automotive electronics, portable electronics, power supplies, and telecommunications. Manufacturers of these devices typically use a thick field oxide together with diffused field limiting rings and channel stop regions to reduce device leakage, reduce undesirable parasitic effects, and to enhance device breakdown. All of these approaches serve to address the same basic problem of maximum electric field relaxation of a planar junction. Each termination approach possesses a set of innate advantages and disadvantages, and the designer attempts to minimize the negative aspects of an approach while simultaneously exploiting the positive aspects. Among these approaches, field-limiting rings are one of the least costly in regards to semiconductor device manufacturing investment, as the same diffusion step used to form the PN junction of the main device can often be used to form the field-limiting rings.

Another device characteristic that semiconductor device manufacturers try to optimize is the on-resistance of the semiconductor devices. The value of this parameter is governed by the concentration of dopant in the semiconductor material in which the semiconductor device is fabricated as well as the thickness of this material. Since it is desirable to have a low on-resistance, it is preferable that the semiconductor material be thin and heavily doped.

Accordingly, it would be advantageous to have a semiconductor device and method for its manufacture that includes a termination structure and is designed to have a high breakdown voltage and a small on-resistance. It would be of further advantage for the method of manufacture to be cost efficient and integrable with available processing techniques.

DETAILED DESCRIPTION OF THE DRAWINGS

Figure 1:
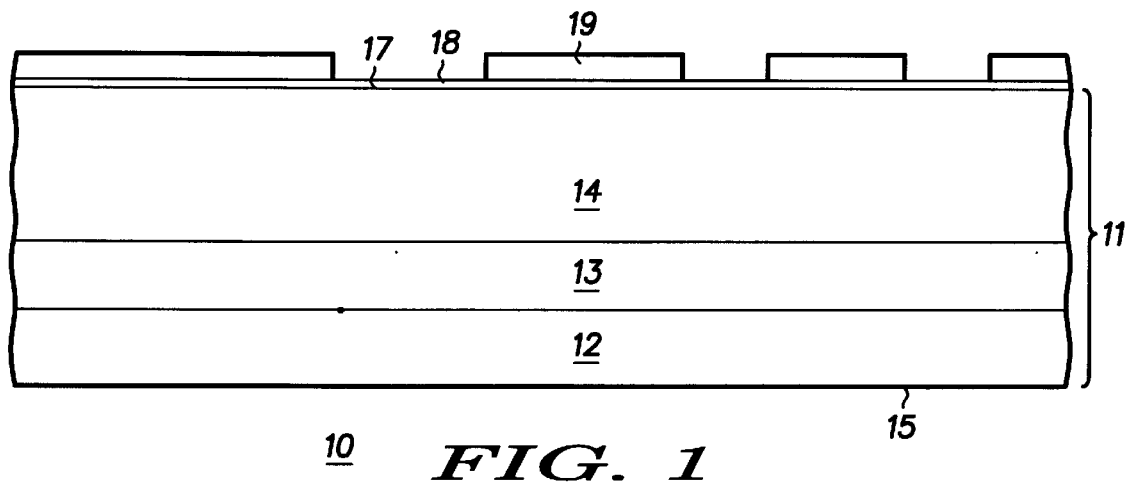
FIG. 1 is a highly enlarged cross-sectional view of a semiconductor device at an early stage of manufacture in accordance with a first embodiment of the present invention.

In general, the present invention relates to a method for manufacturing a power semiconductor device that includes a termination structure as well as structures to lower its on-resistance and increase its breakdown voltage. It should be understood that termination structures are also referred to as stress relaxation regions because they reduce the electric field at the edges of the semiconductor devices. More particularly, the present invention provides a semiconductor device having a field termination structure combined with a drift region that affords a lower on-resistance and a termination structure that helps reduce device leakage, reduces undesirable parasitic effects and enhances the breakdown voltage. Although specific materials, conductivity types, thicknesses, and other parameters are set forth herein, it should be understood that these are not meant to be limiting and only serve to show preferred embodiments of the present invention. Further, it should be understood that the same reference numerals are used in the figures to denote the same elements.

FIG. 1 is a highly enlarged cross-sectional view of a semiconductor device 10 at an early stage of manufacture in accordance with a first embodiment of the present invention. What is shown in FIG. 1 is a body of semiconductor material 11 that is comprised of a buffer layer 13 sandwiched between a substrate 12 and a drift layer 14. Preferably, substrate 12 is silicon of N-type conductivity and has a doping concentration of about $1\times10^{19}$ to $1\times10^{20}$ atoms per cubic centimeter (atoms/cm$^3$). Buffer layer 13 is silicon of N-type conductivity and formed on substrate 12 using a conventional technique such as, for example, an epitaxial growth technique. Similarly, drift layer 14 is of N-type conductivity and formed on buffer layer 13. By way of example, buffer layer 13 has a dopant concentration ranging from about $1\times10^{16}$ to $1\times10^{18}$ atoms/cm$^3$ and a thickness ranging from about 5 to about 20 micrometers and drift layer 14 has a dopant concentration ranging from about $1\times10^{15}$ to $1\times10^{17}$ atoms/cm$^3$ and a thickness ranging from about 30 to about 100 micrometers. For an n-channel device, substrate 12 and buffer layer 13 are preferably doped with arsenic and phosphorus, respectively. It should be understood that buffer layer 13 is an optional layer. Body of semiconductor material 11 has major surfaces 15 and 17.

A masking oxide layer 18 is formed on major surface 17. Masking oxide layer 18 is coated with a layer 19 of photoresist, which is then patterned to expose portions of masking oxide layer 18. Techniques for forming oxide and photoresist layers, as well as patterning the photoresist layers, are well known to those skilled in the art.

Now referring to FIG. 2, the exposed portions of oxide layer 18 and the portions of device layer 14 below oxide layer 18 are removed using, for example, a Reactive Ion Etch (RIE) to form trenches 22 and 23, which extend from major surface 17 through device layer 14 and into buffer layer 13. Photoresist layer 19 and oxide layer 18 are removed and the surfaces of trenches 22 and 23 are cleaned. In accordance with this embodiment, trench 23 is wider than trench 22 and will be used as a portion of a termination structure. Although trenches 22 and 23 are illustrated and described as extending into buffer layer 13, it should be understood this is not a limitation of the present invention. For example, trenches 22 and 23 can extend through buffer layer 13 into substrate 12 or their depth can be such that they do not extend into buffer layer 13.

Figure 2:
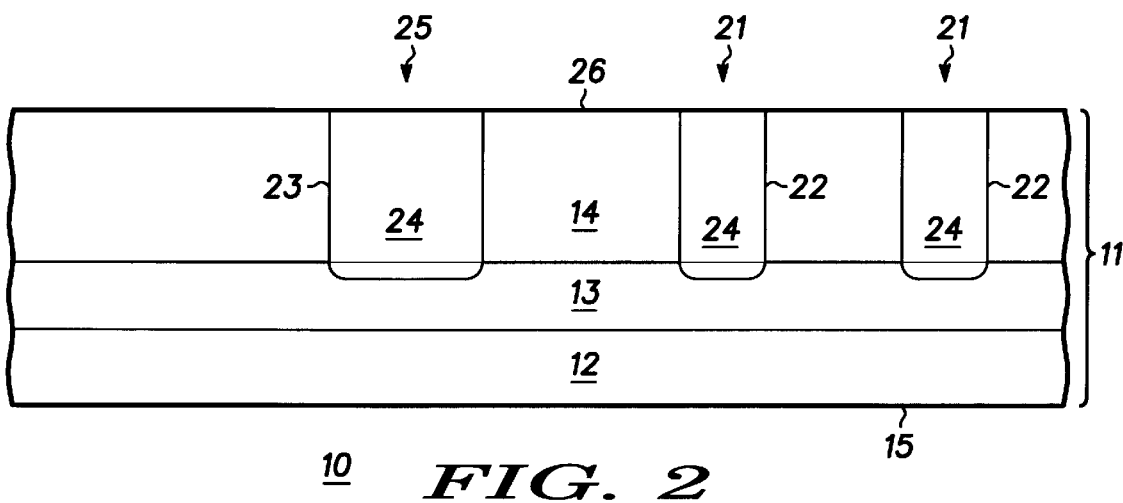
FIG. 2 is a highly enlarged cross-sectional view of the semiconductor device of FIG. 1 at a later stage of manufacture.

Still referring to FIG. 2, a P doped polysilicon trench fill material 24 is formed in trenches 22 and 23, using techniques well known to those skilled in the art. Although not shown, polysilicon trench fill material 24 also conformally coats the remaining portion of oxide layer 18. Although trenches 22 and 23 are described as being filled by a polysilicon trench fill material, it should be understood this is not a limitation of the present invention. For example, trenches 22 and 23 can be filled with an epitaxial material, a polysilicon material, or a combination thereof.

Portions of polysilicon trench fill 24 and oxide layer 18 are removed using, for example, a Chemical Mechanical Polish (CMP) technique to form a planar surface 26. Preferably, the CMP etch terminates at oxide layer 18. Then, oxide layer 18 is removed using, for example, a buffered hydrofluoric acid (HF) solution. This type of etch is commonly referred to as a buffered HF etch. Further, it may be desirable to mask portions of oxide layer 18 prior to performing the buffered HF etch to prevent these portions from being etched. It should be understood that the CMP etch or the combination of the CMP and buffered HF etch serve to planarize the surface of body of semiconductor material 11. The reference number referring to the surface of drift layer 14 has been changed to 26 to reflect the fact that the planar surface includes the portion of polysilicon trench fill 24. Further, polysilicon trench fill 24 cooperates with trenches 22 to form active regions 21 and polysilicon trench fill 24 cooperates with trench 23 to form termination structure 25.

Figure 3:
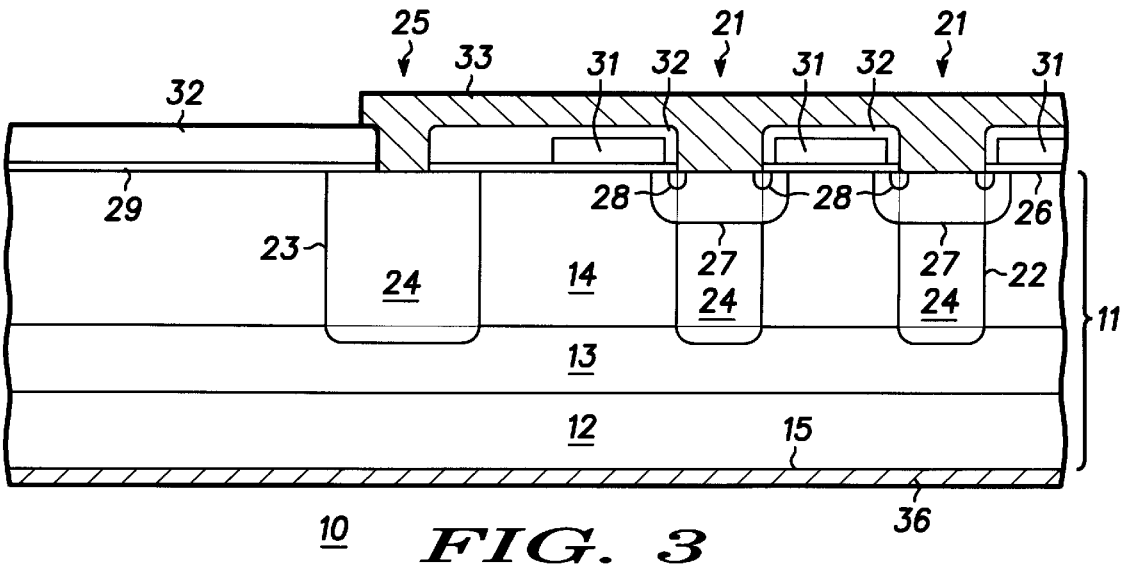
FIG. 3 is a highly enlarged cross-sectional view of the semiconductor device of FIG. 2 at a later stage of manufacture.

Now referring to FIG. 3, a layer 29 of dielectric material, commonly referred to as a gate oxide, is formed on planar surface 26. Gate electrodes 31 are patterned over first dielectric layer 29. Gate electrodes 31 are formed from an electrically conductive material such as polysilicon, aluminum, or the like.

A portion of planar surface 26 is exposed by forming windows in dielectric layer 29. More particularly, the windows expose the portions of planar surface 26 over active regions 21. A plurality of base wells or regions 27 of P-type conductivity are formed in drift layer 14. It will be understood that in an actual device 10 there can be a large number of base wells or P-type conductivity regions 27; however, only two base wells 27 are illustrated for a basic understanding of the invention. Base wells 27, also referred to as base regions, are spaced apart laterally from one another and extend from major surface 26 into polysilicon filled trenches 22. Base wells 27 have a surface concentration of P-type impurity material between approximately $1 \times 10^{16}$ and $1 \times 10^{20}$ atoms/cm$^3$ and form PN junctions with portions of drift layer 14. Base wells 27 may have, for example, a maximum width of approximately 40 micrometers and a maximum depth of approximately 8 micrometers. For a 1,200 volt device, a maximum well width of approximately 30 micrometers and a well depth of approximately 4 micrometers have been employed.

A layer of photoresist (not shown) is patterned over subportions of the exposed portions of planar surface 26. The exposed portions of planar surface 26 adjacent gate electrodes 31 remain exposed after patterning the photoresist.

A source region 28, also referred to as a source or N-type conductivity region, is formed in each base well 27. Source region 28 is shaped as a toroid, in a plan view (not shown), and thus has a central opening. In the cross-sectional view shown in FIG. 3, this toroid is seen as two source wells of N-type conductivity. A channel is formed in the base region between source regions 27 and drift region 14 which is adjacent major surface 26. Source regions 28 extend from major surface 26 into base wells 27 and have a surface concentration of N-type dopant of between approximately $1 \times 10^{17}$ and $1 \times 10^{21}$ atoms/cm$^3$. The doping concentration of source regions 28 is greater than that of base wells 27. By way of example, source regions 28 have a width ranging between approximately 1 and approximately 10 micrometers and a maximum depth of approximately 1.5 micrometers. For example, for a 1,200 volt device, a source width of approximately 3 micrometers and a source depth of approximately 1 micrometer have been employed.

Although source regions 28 have been described as being a toroid, it should be understood this is not a limitation of the present invention. For example, source regions 28 can be formed as stripes. The photoresist is then removed.

It should be noted that each gate electrode 31 extends laterally from a portion of a source well 28 in one base well 27 to a portion of a proximal source well 28 in an adjacent base well 27. Thus, gate electrodes 31 extend over two adjacent channels.

Gate electrodes 31 and exposed portions of dielectric layer 29 are covered by a layer 32 of dielectric material. A portion of planar surface 26 is exposed by forming windows in dielectric layers 29 and 32. More particularly, the windows expose the portions of planar surface 26 over active regions 21 and a portion of polysilicon filled termination well 30. Subsequently, a source electrode or contact 33 is formed over the exposed first portion of planar surface 26 and over dielectric layer 32. Thus, source electrode 33 forms an electrical contact which is over a portion of base wells or regions 27 and a portion of source regions 28. Preferably, source contact 33 is aluminum or an aluminum alloy as is well known in the art.

An ohmic or conductive layer 36 is formed over surface 15. In a preferred embodiment, ohmic layer 36 is a multi-layer structure comprising a titanium layer, a nickel layer, and a silver layer. The multi-layer structure has a total thickness of about 1–4 micrometers. Substrate layer 12 together with ohmic layer 36 provide a common drain for semiconductor device 10.

Techniques for the formation of base and source regions 27 and 28, respectively, dielectric layers 29 and 32, gate electrodes 31, source electrode 23, and ohmic layer 36 include conventional semiconductor processing steps such as masking, ion implantation, diffusion, photolithography, etc.

Figure 4:
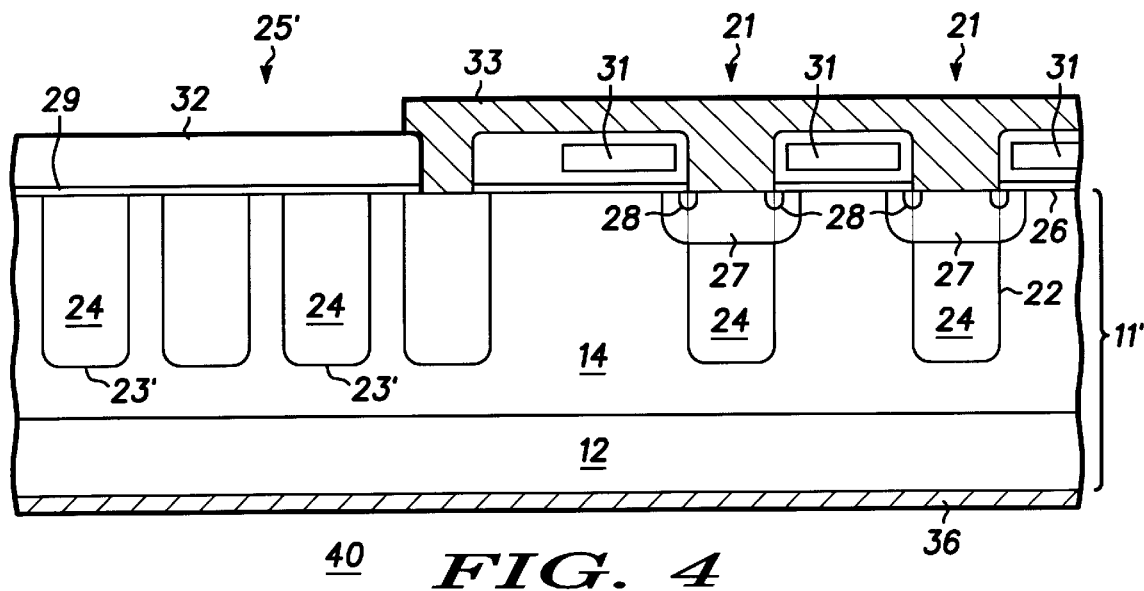
FIG. 4 is a highly enlarged cross-sectional view of a semiconductor device in accordance with a second embodiment of the present invention.

FIG. 4 is a highly enlarged cross-sectional view of a semiconductor device 40 in accordance with a second embodiment of the present invention. In this embodiment, semiconductor device 40 is an Insulated Gate Field Effect Transistor that is fabricated in the device region of body of semiconductor material 11'. The difference between IGFET 40 and IGFET 10 is that body of semiconductor material 11' is comprised of substrate 12 and drift layer 14, i.e., buffer layer 13 is absent. In addition, termination structure 25 has been replaced by a plurality of trenches 25' that are narrower than trench 25. Thus, polysilicon 24 cooperates with trenches 23' to form a termination structure 25'.

Figure 5:
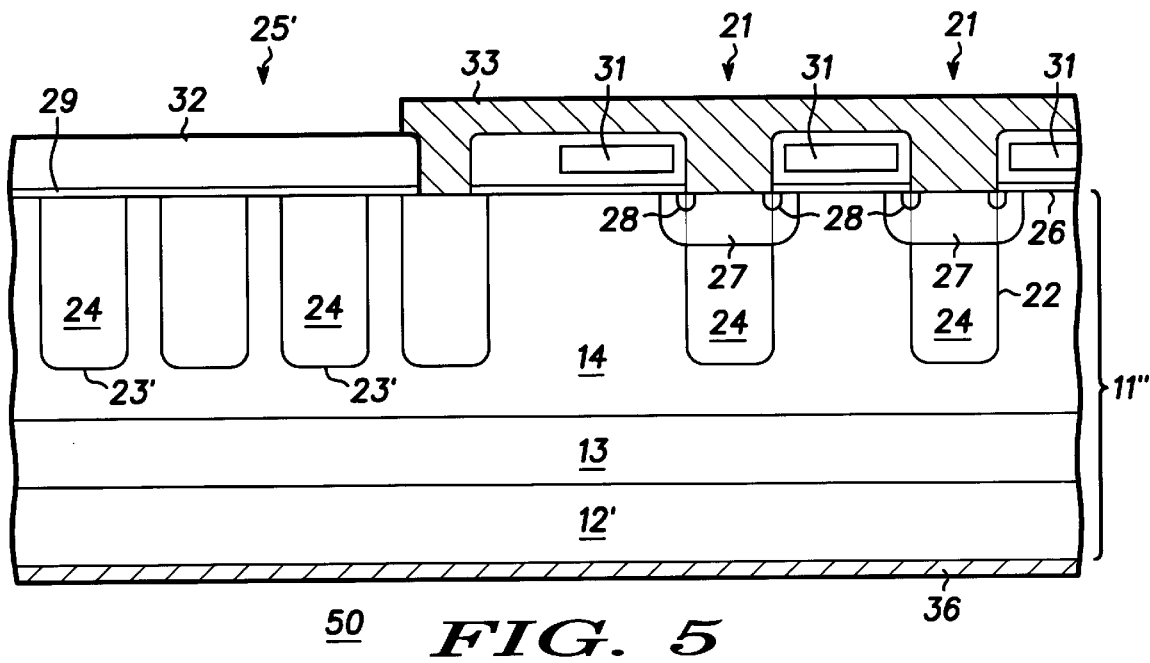
FIG. 5 is a highly enlarged cross-sectional view of a semiconductor device in accordance with a third embodiment of the present invention.

FIG. 5 is a highly enlarged cross-sectional view of a semiconductor device 50 in accordance with a third embodiment of the present invention. In particular, FIG. 5 illustrates a highly enlarged cross-sectional view of an Insulated Gate Bipolar Transistor (IGBT) 50. Accordingly, the difference between semiconductor device 50 and semiconductor device 40 is that body of semiconductor material 11" is comprised of a substrate layer 12' of P-type conductivity on which a buffer layer 13 is formed. Drift layer 14 is disposed on buffer layer 13. Substrate layer 12' together with ohmic layer 36 provide a common drain for IGBT 50.

It should be understood that the presence of buffer layer 13 is not a limitation of the present invention and that buffer layer 13 may not be present.

By now it should be appreciated that a semiconductor device having a termination structure and a reduced on-resistance and a method for manufacturing the semiconductor device have been provided. An advantage of the semiconductor device of the present invention is that it can be used to manufacture power semiconductor devices having a reduced on-resistance using fewer masking steps, thereby lowering the cost of manufacturing the semiconductor device.

While the invention has been described in specific embodiments thereof, it is evident that many alterations, modifications, and variations will be apparent to those skilled in the art. Further, it is intended to embrace all such alterations, modifications, and variations in the appended claims.

What is claimed is:

1. A method for manufacturing a semiconductor device, comprising the steps of:

providing a semiconductor material having an active region and a field relaxation region;

forming a plurality of doped regions of a first conductivity type in the active region of the semiconductor material, wherein doped regions of the plurality of doped regions are spaced apart from each other by regions of the semiconductor material that are of a second conductivity type; and forming a plurality of trenches in the active region underlying the doped regions of a first conductivity type, and a plurality of trenches in the field relaxation region providing an edge termination structure in the semiconductor material.

2. The method of claim 1, wherein the step of providing the semiconductor material includes epitaxially growing silicon of the second conductivity type and a first dopant concentration on a body of silicon of the second conductivity type and a second dopant concentration, the first dopant concentration being less than the second dopant concentration.

3. The method of claim 1, wherein the step of forming the plurality of trenches includes using at least one doped region of the plurality of doped regions, wherein the at least one doped region surrounds an active region of the semiconductor material.

4. The method of claim 3, further comprising forming an insulated gate semiconductor device in the active region.

5. The method of claim 4, wherein the step of forming an insulated gate semiconductor device includes forming one of an insulated gate field effect transistor or an insulated gate bipolar transistor as the insulated gate semiconductor device.

6. The method of claim 1, wherein the step of forming the plurality of doped regions includes filling each of the plurality of trenches with polysilicon, the polysilicon being of the first conductivity type.

7. The method of claim 1, wherein the step of forming the plurality of doped regions includes filling each of the plurality of trenches with an epitaxial material, the epitaxial material being of the first conductivity type.

8. The method of claim 1, wherein the step of forming the plurality of trenches includes forming a plurality of substantially concentric field-limiting rings, including an inner most field-limiting ring, an outermost field-limiting ring, and at least one field limiting ring between an innermost field-limiting ring and the outermost field-limiting ring.

9. A method for manufacturing a power semiconductor device, comprising the steps of:

providing a body of semiconductor material having first and second major surfaces, an active region, and a field relaxation region;

forming a plurality of trenches in the active region and a plurality of trenches in the field relaxation region;

filling the plurality of trenches in the active region and the plurality of trenches in the field relaxation region with a semiconductor material of a first conductivity type;

forming a gate structure over the first major surface and a portion of the source region; and forming a source region in the active region.

10. The method of claim 9, further including the step of contacting the source region with a first conductive material and contacting the second major surface with a second conductive material.

11. The method of claim 9, wherein the step of providing the body of semiconductor material includes:

providing a semiconductor substrate of a second conductivity type and a first dopant concentration; and forming a first layer of semiconductor material of the second conductivity type and a second concentration on the semiconductor substrate.

12. The method of claim 11, further including forming second layer of semiconductor material of the second conductivity type and a third dopant concentration on the second layer of semiconductor material.

13. The method of claim 9, wherein the step of providing the body of semiconductor material includes:

providing a semiconductor substrate of the first conductivity type and a first dopant concentration; and forming a layer of semiconductor material of a second conductivity type and a second dopant concentration on the semiconductor substrate.

14. The method of claim 9, wherein the step of providing the body of semiconductor material includes:

providing a semiconductor substrate of the first conductivity type and a first dopant concentration;

forming a buffer layer of a second conductivity type and a second dopant concentration on the semiconductor substrate; and forming a drift layer of the second conductivity type and a third dopant concentration on the buffer layer.

15. The method of claim 9, wherein the step of filling the plurality of trenches includes planarizing the material used to fill the plurality of trenches.

16. The method of claim 9, further including forming an electrical contact to the field relaxation region.

17. The method of claim 9, wherein the steps of forming the plurality of trenches includes using a Reactive Ion Etch technique to form the plurality of trenches.

18. A method for manufacturing a trench semiconductor device having a substrate with a first major surface, comprising the steps of:

forming an active region and a field relaxation region in the substrate;

forming a gate structure in the active region, and on the first major surface of the substrate; and filling at least one trench in the active region and at least one trench in the field relaxation region with a material of a first conductivity type to form the trench semiconductor device.

19. The method of claim 18, further including forming a field relaxation region contact overlying the field relaxation region.

20. The method of claim 18, further including forming a shallow doped region of a first conductivity type.

21. The method of claim 20, further including forming a first contact overlying the shallow doped region.

22. The method of claim 18, further including forming an epitaxial layer of a second conductivity type and a second dopant concentration.

23. The method of claim 22, wherein the substrate is of the second conductivity type and a first dopant concentration.

24. The method of claim 18, wherein the filling step includes one of a polysilicon material or an epitaxial material.

* * * * *